United States Patent
Sasaki et al.

(10) Patent No.: US 10,910,252 B2
(45) Date of Patent: *Feb. 2, 2021

(54) PLASMA PROCESSING APPARATUS

(71) Applicant: TOKYO ELECTRON LIMITED, Tokyo (JP)

(72) Inventors: Yasuharu Sasaki, Miyagi (JP); Akira Ishikawa, Miyagi (JP); Ryo Chiba, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/460,055

(22) Filed: Jul. 2, 2019

(65) Prior Publication Data

US 2019/0326153 A1 Oct. 24, 2019

Related U.S. Application Data

(62) Division of application No. 15/829,096, filed on Dec. 1, 2017, now Pat. No. 10,388,558.

(30) Foreign Application Priority Data

Dec. 5, 2016 (JP) ................................. 2016-235595
Sep. 12, 2017 (JP) ................................. 2017-174946

(51) Int. Cl.
*H01L 21/687* (2006.01)
*H01L 21/683* (2006.01)

(52) U.S. Cl.
CPC .... *H01L 21/68742* (2013.01); *H01L 21/6833* (2013.01); *H01L 21/68757* (2013.01); *H01L 21/6831* (2013.01); *Y10T 279/23* (2015.01)

(58) Field of Classification Search
CPC .......... H01L 21/6833; H01L 21/68742; H01L 21/68757
See application file for complete search history.

(56) References Cited

U.S. PATENT DOCUMENTS 5,625,526 A * 4/1997 Watanabe ............... G03F 7/707
361/234
7,292,428 B2 * 11/2007 Hanawa ............. H01L 21/6831
361/234

(Continued)

FOREIGN PATENT DOCUMENTS

JP 05-175318 A 7/1993
JP 05-283514 A 10/1993

(Continued)

*Primary Examiner* — Eric A. Gates
(74) *Attorney, Agent, or Firm* — Rothwell, Figg, Ernst & Manbeck, P.C.

(57) ABSTRACT

A plasma processing apparatus includes an electrostatic chuck and a lifter pin. The electrostatic chuck has a mounting surface on which a target object is mounted and a back surface opposite to the mounting surface, and a through hole formed through the mounting surface and the back surface. The lifter pin is at least partially formed of an insulating member and has a leading end accommodated in the through hole. The lifter pin vertically moves with respect to the mounting surface to vertically transfer the target object. A conductive material is provided at at least one of a leading end portion of the lifter pin which corresponds to the through hole and a wall surface of the through hole which faces the lifter pin.

12 Claims, 12 Drawing Sheets

(56) References Cited

U.S. PATENT DOCUMENTS

| | | | |
|---|---|---|---|
| 8,252,118 B2 * | 8/2012 | Shibuya | C23C 14/50 |
| | | | 118/723 R |
| 8,680,466 B2 * | 3/2014 | Kanno | G01R 31/307 |
| | | | 250/306 |
| 9,142,391 B2 | 9/2015 | Yamamoto | |
| 9,240,340 B2 * | 1/2016 | Shiraiwa | H01L 21/6833 |
| 9,865,494 B2 * | 1/2018 | Ichinose | H01L 21/6838 |
| 10,040,175 B2 * | 8/2018 | Kumakura | B25B 11/005 |
| 10,147,628 B2 * | 12/2018 | Shiraiwa | H01L 21/6833 |
| 10,153,138 B2 * | 12/2018 | Aoto | H01L 21/6831 |
| 10,283,397 B2 * | 5/2019 | Willwerth | B66F 3/25 |
| 10,388,558 B2 * | 8/2019 | Sasaki | H01L 21/68742 |
| 2004/0107911 A1 | 6/2004 | Hur et al. | |
| 2004/0159286 A1 | 8/2004 | Aoki et al. | |
| 2009/0139979 A1 | 6/2009 | Komatsu | |
| 2009/0283976 A1 * | 11/2009 | Kaneko | H01L 21/6831 |
| | | | 279/128 |
| 2010/0078129 A1 | 4/2010 | Himori et al. | |
| 2014/0216332 A1 * | 8/2014 | Omori | H01L 21/68742 |
| | | | 118/50 |
| 2015/0340261 A1 * | 11/2015 | Katayama | H01L 21/6833 |
| | | | 269/8 |
| 2016/0153091 A1 | 6/2016 | Hayami et al. | |

FOREIGN PATENT DOCUMENTS

| | | |
|---|---|---|
| JP | 11-340309 A | 12/1999 |
| JP | 2000-195935 A | 7/2000 |

* cited by examiner

FIG.7

| f(Hz) | | ρ(Ω.m) | μs | δ(m) |
|---|---|---|---|---|
| 40M | FIRST CONDUCTIVE MATERIAL | $4.5e^2$ | 1 | $1.69e^0$ |
| | SECOND CONDUCTIVE MATERIAL | $1.0e^6$ | 1 | $7.96e^1$ |
| | THIRD CONDUCTIVE MATERIAL | $1.0e^{12}$ | 1 | $7.96e^4$ |
| 400k | FIRST CONDUCTIVE MATERIAL | $4.5e^2$ | 1 | $1.69e^1$ |
| | SECOND CONDUCTIVE MATERIAL | $1.0e^6$ | 1 | $7.96e^2$ |
| | THIRD CONDUCTIVE MATERIAL | $1.0e^{12}$ | 1 | $7.96e^5$ |

PLASMA PROCESSING APPARATUS

CROSS-REFERENCE TO RELATED APPLICATIONS

This application is a divisional of U.S. application Ser. No. 15/829,096, filed Dec. 1, 2017, which claims priority to Japanese Patent Application Nos. 2016-235595 and 2017-174946 respectively filed on Dec. 5, 2016 and Sep. 12, 2017, the disclosures of which are incorporated herein in their entirety by reference, and priority is claimed to each of the foregoing.

FIELD OF THE INVENTION

The disclosure relates to a plasma processing apparatus.

BACKGROUND OF THE INVENTION

Conventionally, there is known a plasma processing apparatus for performing plasma treatment on a target object such as a wafer or the like by using a plasma. The plasma processing apparatus includes a mounting table serving as an electrode and configured to hold the target object. The mounting table is provided in a processing chamber capable of forming a vacuum space. The plasma processing apparatus performs the plasma treatment on the target object mounted on the mounting table by applying a predetermined high frequency power to the mounting table. Through holes into which lifter pins are inserted are formed in the mounting table. In the plasma processing apparatus, when the target object needs to be transferred, the lifter pins project from the through holes and separate the target object from the mounting table while supporting a backside of the target object. The lifter pins are made of an insulating material in order to suppress occurrence of abnormal discharge caused by exposure to a plasma. Lower portions of the lifter pins are made of a conductive material (see, e.g., Japanese Patent Application Publication No. 2000-195935).

Recently, in the plasma processing apparatus, a voltage of a high frequency power that is applied to the mounting table to perform the plasma treatment is increased. When the voltage of the high frequency power applied to the mounting table is increased, the abnormal discharge may occur at the through holes into which the lifter pins are inserted. In the plasma processing apparatus, the abnormal discharge at the through holes leads to deterioration of a quality of the target object. This may result in deterioration of a yield.

SUMMARY OF THE INVENTION

In accordance with an aspect, there is provided a plasma processing apparatus including an electrostatic chuck and a lifter pin. The electrostatic chuck has a mounting surface on which a target object is mounted and a back surface opposite to the mounting surface, and a through hole formed through the mounting surface and the back surface. The lifter pin is at least partially formed of an insulating member and has a leading end accommodated in the through hole. The lifter pin vertically moves with respect to the mounting surface to vertically transfer the target object. A conductive material is provided at at least one of a leading end portion of the lifter pin which corresponds to the through hole and a wall surface of the through hole which faces the lifter pin.

In accordance with another aspect, there is provided a plasma processing apparatus including: an electrostatic chuck including a mounting surface on which a target object is mounted and a back surface opposite to the mounting surface, the electrostatic chuck having a first through hole formed through the mounting surface and the back surface; a base including a supporting surface for supporting the electrostatic chuck, the base having a second through hole communicating with the first through hole; and an insertion member provided in the first through hole and the second through hole, wherein at least a portion of the insertion member, which corresponds to a connection region between the first through hole of the electrostatic chuck and the second through hole of the base, is formed of an elastic material.

In accordance with another aspect, there is provided a plasma processing apparatus including: an electrostatic chuck including a mounting surface on which a target object is mounted and a back surface opposite to the mounting surface, the electrostatic chuck having a first through hole and a second through hole formed through the mounting surface and the back surface; a lifter pin, which is at least partially formed of an insulating member and has a leading end accommodated in the through hole, configured to vertically move with respect to the mounting surface to vertically transfer the target object; base including a supporting surface for supporting the electrostatic chuck, the base having a third through hole communicating with the second through hole; and an insertion member provided in the second through hole and the third through hole, wherein a conductive material is provided at at least one of a leading end portion of the lifter pin which corresponds to the first through hole and a wall surface of the first through hole which faces the lifter pin, and at least a portion of the insertion member, which corresponds to a connection region between the second through hole of the electrostatic chuck and the third through hole of the base, is formed of an elastic material.

BRIEF DESCRIPTION OF THE DRAWINGS

The objects and features of the disclosure will become apparent from the following description of embodiments, given in conjunction with the accompanying drawings, in which:

FIG. 7 shows an example of a result of a skin effect;

DETAILED DESCRIPTION OF THE EMBODIMENTS

Figure 1:
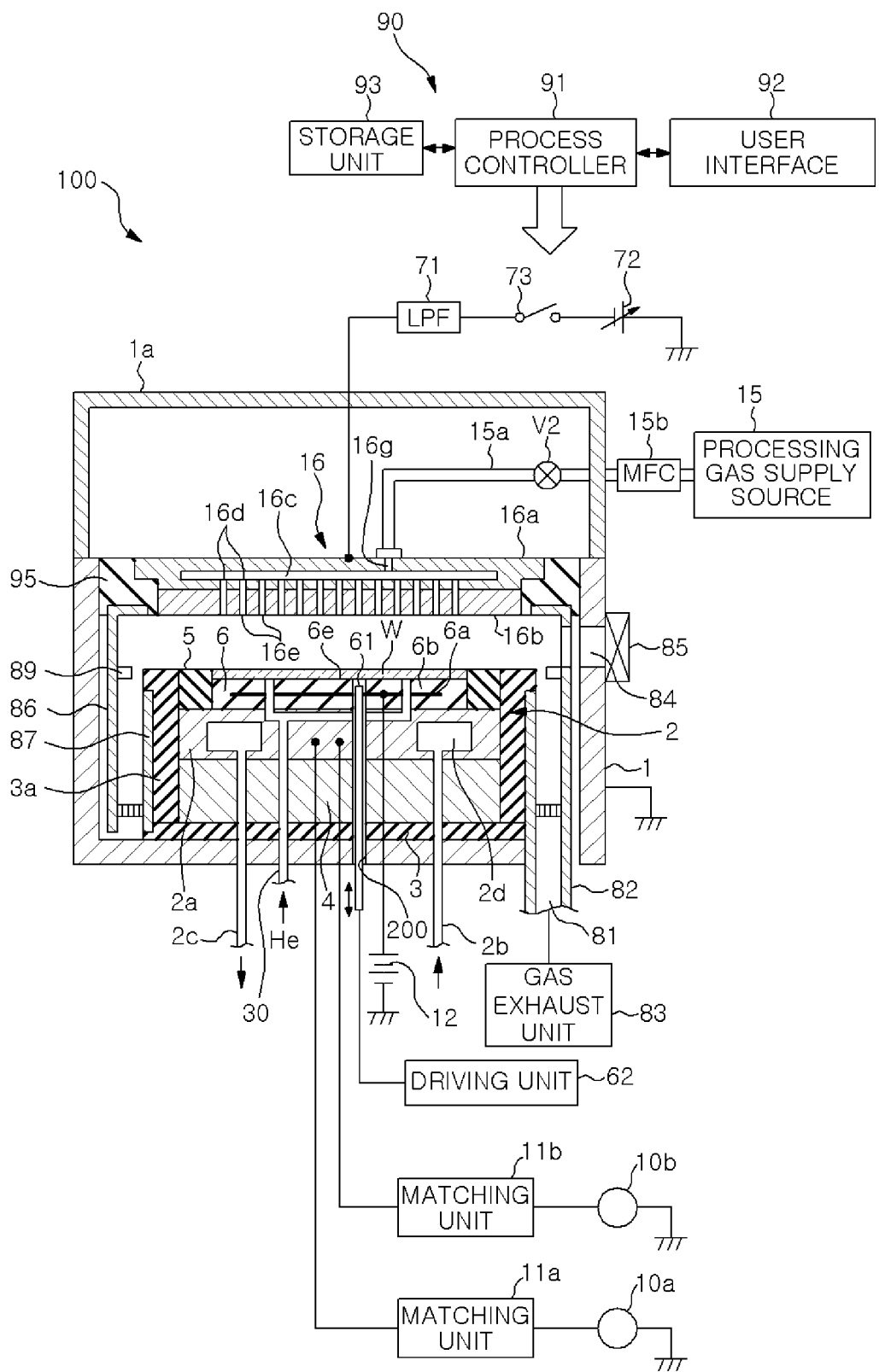
FIG. 1 is a schematic cross sectional view showing a configuration of a plasma processing apparatus according to an embodiment.

Hereinafter, embodiments of a plasma processing apparatus will be described in detail with reference to the accompanying drawings. Like reference numerals will be given to like or corresponding parts throughout the drawings. The disclosure is not limited to the embodiments. The embodiments may be appropriately combined without contradicting processing contents. Terms "upper" and "lower" are used based on illustrated states, for convenience.

First Embodiment (Configuration of Plasma Processing Apparatus)

FIG. 1 is a schematic cross sectional view showing a configuration of a plasma processing apparatus according to an embodiment. A plasma processing apparatus 100 includes an airtight processing chamber 1 that is airtightly sealed and electrically connected to a ground potential. The processing chamber 1 has a cylindrical shape and is made of, e.g., aluminum or the like. The processing chamber 1 defines a processing space where a plasma is generated. A mounting table 2 for horizontally supporting a semiconductor wafer (hereinafter, simply referred to as "wafer") that is a target object is provided in the processing chamber 1. The mounting table 2 includes a base 2a and an electrostatic chuck (ESC) 6. The base 2a is made of a conductive metal, e.g., aluminum, and serves as a lower electrode. The electrostatic chuck 6 has a function of attracting and holding the wafer W. The mounting table 2 is supported by a supporting table 4. The supporting table 4 is supported by a supporting member 3 made of, e.g., quartz or the like. A focus ring 5 made of, e.g., single crystalline silicon, is provided on an outer periphery of the mounting table 2. In the processing chamber 1, a cylindrical inner wall member 3a made of, e.g., quartz or the like, surrounds outer peripheries of the mounting table 2 and the supporting table 2.

The base 2a is connected to a first RF power supply 10a via a first matching unit 11a and also connected to a second RF power supply 10b via a second matching unit 11b. The first RF power supply 10a is used for plasma generation and configured to supply a high frequency power having a predetermined frequency to the base 2a of the mounting table 2. The second RF power supply 10b is used for ion attraction (bias) and configured to supply a high frequency power having a frequency lower than that of the first RF power supply 10a to the base 2a of the mounting table 2. In this manner, a voltage can be applied to the mounting table 2. A shower head 16 serving as an upper electrode is provided above the mounting table 2 to face the mounting table 2. The shower head 16 and the mounting table 2 function as a pair of electrodes (upper electrode and lower electrode).

The electrostatic chuck 6 has a structure in which an electrode 6a is buried in an insulator 6b. A DC power supply 12 is connected to the electrode 6a. The wafer W is attracted and held on the electrostatic chuck 6 by a Coulomb force generated by applying a DC voltage from the DC power supply 12 to the electrode 6a.

A coolant flow path 2d is formed in the mounting table 2. The coolant flow path 2d is connected to a coolant inlet line 2b and a coolant outlet line 2c. By circulating an appropriate coolant, e.g., cooling water or the like, through the coolant flow path 2d, the mounting table 2 can be controlled to a predetermined temperature. A gas supply line 30 for supplying a cold heat transfer gas (backside gas) such as He gas or the like to the backside of the wafer W is formed through the mounting table 2 or the like. The gas supply line 30 is connected to a gas supply source (not shown). With this configuration, the wafer W attracted and held on the mounting table 2 by the electrostatic chuck 6 is controlled to a predetermined temperature.

The mounting table 2 is provided with a plurality of, e.g., three pin through holes 200 (only one shown in FIG. 1). Lifter pins 61 are inserted into the pin through holes 200. The lifter pins 61 are connected to a driving unit 62 and vertically moved by the driving unit 62. The structures of the pin through holes 200 and the lifter pins 61 will be described later.

The shower head 16 is provided at a ceiling wall of the processing chamber 1. The shower head 16 includes a main body 16a and an upper ceiling plate 16b serving as an electrode plate. The shower head 16 is supported at an upper portion of the processing chamber 1 through an insulating member 95. The main body 16a is made of a conductive material, e.g., aluminum having an anodically oxidized surface, and detachably holds the upper ceiling plate 16b therebelow.

A gas diffusion space 16c is formed in the main body 16a. A plurality of gas through holes 16d is formed in the bottom portion of the main body 16a to be positioned below the gas diffusion space 16c. Gas injection holes 16e are formed through the upper ceiling plate 16b in a thickness direction thereof. The gas injection holes 16e respectively communicate with the gas through holes 16d. With this configuration, a processing gas supplied into the gas diffusion space 16c is distributed and supplied in a shower shape into the processing chamber 1 through the gas through holes 16d and the gas injection holes 16e.

A gas inlet port 16g for introducing the processing gas into the gas diffusion space 16c is formed in the main body 16a. One end of a gas supply line 15a is connected to the gas inlet port 16g. The other end of the gas supply line 15a is connected to a processing gas supply source (gas supply unit) 15 for supplying the processing gas. A mass flow controller (MFC) 15b and an opening/closing valve V2 are installed in the gas supply line 15a in that order from an upstream side. The processing gas for plasma etching is supplied from the processing gas supply source 15 into the gas diffusion space 16c through the gas supply line 15a and then distributed and supplied in a shower shape from the gas diffusion space 16c into the processing chamber 1 through the gas through holes 16d and the gas injection holes 16e.

A variable DC power supply 72 is electrically connected to the shower head 16 serving as the upper electrode via a low pass filter (LPF) 71. A power supply of the variable DC power supply 72 is on-off controlled by an on/off switch 73. Current/voltage of the variable DC power supply 72 and on/off of the on/off switch 73 are controlled by a control unit 90 to be described later. As will be described later, when a plasma is generated in the processing space by applying the high frequency power from the first and the second RF power supply 10a and 10b to the mounting table 2, the on/off switch 73 is turned on by the control unit 90 and a predetermined DC voltage is applied to the shower head 16 serving as the upper electrode, if necessary.

A cylindrical ground conductor 1a extends upward from a sidewall of the processing chamber 1 to a position higher than a height of the shower head 16. The cylindrical ground conductor 1a has a ceiling wall at the top thereof.

A gas exhaust port 81 is formed at a bottom portion of the processing chamber 1. A gas exhaust unit 83 is connected to the gas exhaust port 81 via a gas exhaust line 82. The gas exhaust unit 83 has a vacuum pump. By operating the vacuum pump, a pressure in the processing chamber 1 can be decreased to a predetermined vacuum level. A loading/unloading port 84 for the wafer W and a gate valve for opening/closing the loading/unloading port 84 are provided at the sidewall of the processing chamber 1.

A deposition shield 86 is provided along an inner surface of the sidewall of the processing chamber 1. The deposition shield 86 prevents etching by-products (deposits) from being attached to the processing chamber 1. A conductive member (GND block) 89 is provided at a portion of the deposition shield 86 at substantially the same height as the height of the wafer W. The conductive member 89 is connected such that a potential with respect to the ground can be controlled. Due to the presence of the conductive member 89, abnormal discharge is prevented. A deposition shield 87 extending along the inner wall member 3a is provided to correspond to a lower portion of the deposition shield 86. The deposition shields 86 and 87 are detachably provided.

The operation of the plasma processing apparatus 100 configured as described above is integrally controlled by the control unit 90. The control unit 90 includes: a process controller 91 having a CPU and configured to control the respective components of the plasma processing apparatus 100; a user interface 92; and a storage unit 93.

The user interface 92 includes a keyboard through which a process manager inputs commands to operate the plasma processing apparatus 100, a display for visualizing an operational state of the plasma processing apparatus 100, and the like.

The storage unit 93 stores therein recipes including a control program (software), processing condition data and the like for realizing various processes performed by the plasma processing apparatus 100 under the control of the process controller 91. If necessary, a recipe is retrieved from the storage unit 93 in response to a command from the user interface 92 or the like and executed by the process controller 91. Accordingly, a desired process is performed in the plasma processing apparatus 100 under the control of the process controller 91. The recipes including the control program, the processing condition data and the like can be stored in a computer-readable storage medium (e.g., a hard disk, a CD, a flexible disk, a semiconductor memory, or the like) or can be transmitted, when needed, from another apparatus through, e.g., a dedicated line, and used on-line.

(Configuration of Principal Parts of Mounting Table)

Figure 2:
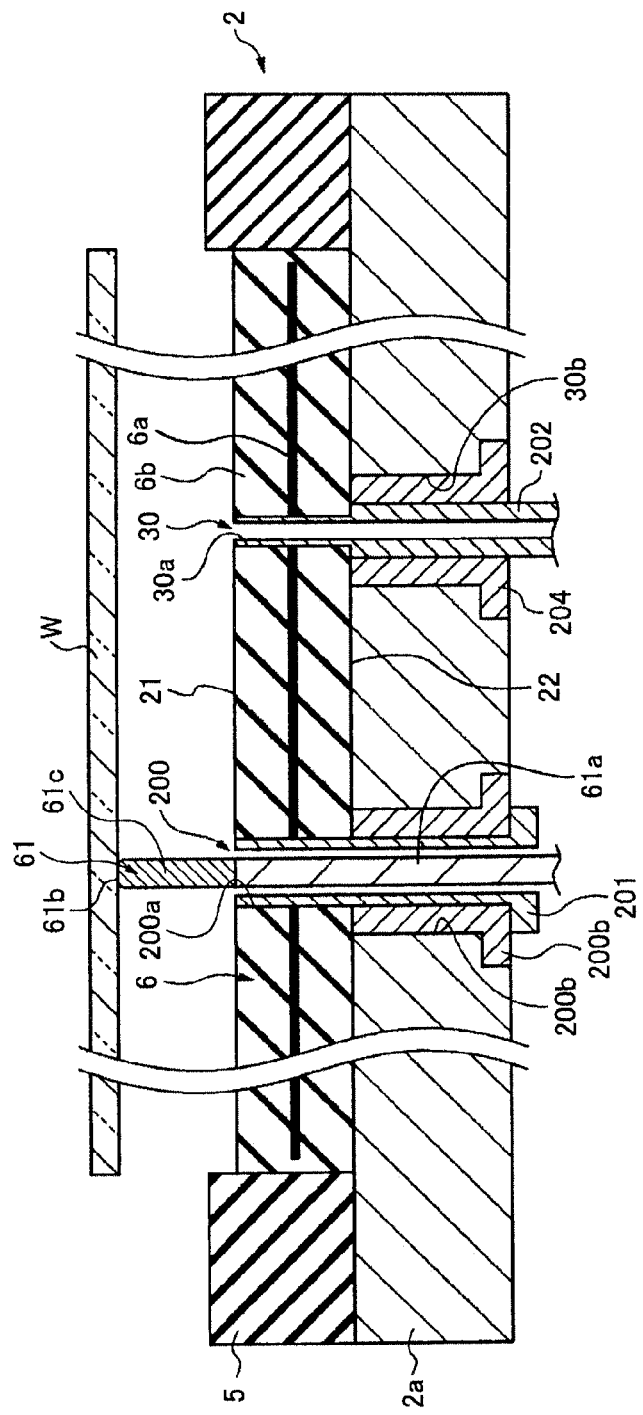
FIGS. 2 and 3 are schematic cross sectional views showing a mounting table in the plasma processing apparatus shown in FIG. 1.
Figure 3:
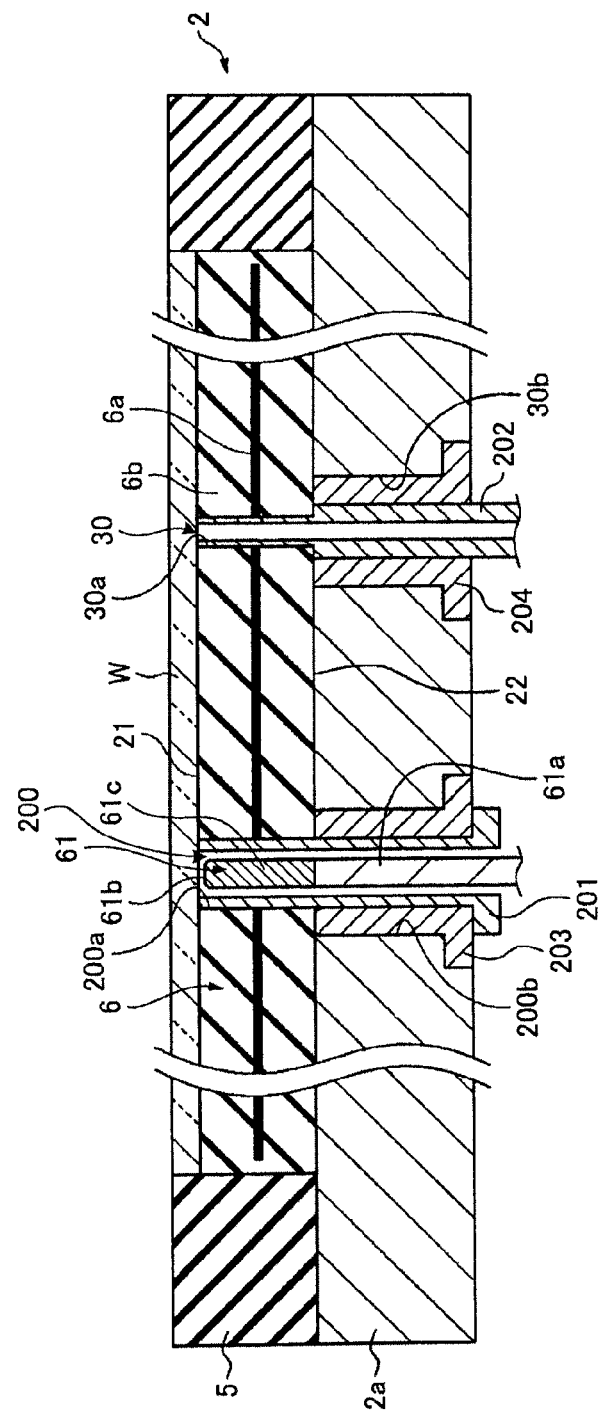

The configuration of principal parts of the mounting table 2 will be described with reference to FIGS. 2 and 3. FIGS. 2 and 3 are schematic cross sectional views showing the mounting table 2 in the plasma processing apparatus 100 shown in FIG. 1. FIG. 2 shows a case in which the wafer W is raised and supported by the lifter pins 61. FIG. 3 shows a case in which the wafer W is held on the electrostatic chuck 6 by lowering the lifter pins 61. As described above, the mounting table 2 includes the base 2a and the electrostatic chuck 6. The lifter pins 61 can be inserted from below the base 2a to protrude beyond the electrostatic chuck 6.

The electrostatic chuck 6 is formed in a disc shape and has a mounting surface 21 for mounting the wafer W thereon and a back surface 22 opposite to the mounting surface 21. The mounting surface 21 has a circular shape and supports the disc-shaped wafer W while being in contact with the backside of the wafer W. The base 2a is in contact with the back surface 22 of the electrostatic chuck 6.

An end portion (gas hole) of the gas supply line 30 is formed at the mounting surface 21. The gas supply line 30 supplies He gas or the like for cooling. The end portion of the gas supply line 30 is defined by a through hole 30a formed in the electrostatic chuck 6 and a through hole 30b formed in the base 2a. The through hole 30a extends from the back surface 22 to the mounting surface 21 of the electrostatic chuck 6. In other words, the electrostatic chuck 6 defines an inner wall of the through hole 30a. The through hole 30b extends from a back surface of the base 2a to a contact surface with the electrostatic chuck 6. In other words, the base 2a defines an inner wall of the through hole 30b. A diameter of the through hole 30b is greater than that of the through hole 30a. The electrostatic chuck 6 and the base 2a are arranged such that the through holes 30a and 30b communicate with each other. A gas sleeve 204 and a gas spacer 202 are provided in the gas supply line 30.

The pin through holes 200 for accommodating the lifter pins 61 are formed in the mounting surface 21. Each of the pin through holes 200 includes a through hole 200a formed in the electrostatic chuck 6 and a through hole 200b formed in the base 2a. The through hole 200a of the pin through hole 200 has a diameter slightly greater (by, e.g., 0.1 mm to 0.5 mm) than the outer diameter of the lifter pin 61 and, thus, the lifter pin 61 can be accommodated therein. The diameter of the through hole 200b is greater than, e.g., the diameter of the through hole 200a. A pin sleeve 203 and a pin spacer 201 are provided between the inner wall of the through hole 200a and the lifter pin 61. In the electrostatic chuck 6 of the present embodiment, the pin sleeve 203 and the pin spacer 201 define the pin through hole 200.

At least a part of the lifter pin 61 is formed of an insulating material. For example, the lift pin 61 includes a pin main body 61a made of insulating ceramic or resin and a pin upper end portion 61b. The pin main body 61a is formed in a cylindrical shape and has an outer diameter of, e.g., a few mm. The pin upper end portion 61b which comes in contact with the wafer W is formed by chamfering the pin main body 61a and has a spherical surface. The spherical surface has, e.g., a considerably large curvature, and the entire pin upper end portion 61b of the lifter pin 61 is positioned close to the backside of the wafer W.

The lifter pin 61 has a conductive film 61c formed of a conductive material at a leading end portion corresponding to the pin through hole 200. For example, the liter pin 61 has the conductive film 61c extending from the upper end portion 61b of the pin main body 61a by a distance corresponding to a thickness of the electrostatic chuck 6. It is preferable that the upper end portion 61b which comes in contact with the wafer W is not covered with the conductive film 61c. However, the upper end portion 61b of the lifter pin 61 may be covered with the conductive film 61c.

The lifter pin 61 is vertically moved through the pin through hole 200 by the driving unit 62 shown in FIG. 1. The lifter pin 51 can protrude and retract with respect to the mounting surface 21 of the mounting table 2. The driving unit 62 controls a height of a stop position of the lifter pin 61 such that the upper end portion 61b of the lifter pin 61 is positioned directly below the backside of the wafer W when the lifter pin 61 is accommodated in the pin through hole 200.

As shown in FIG. 2, when the lifter pin 61 is raised, a part of the pin main body 61a and the pin upper end portion 61b protrude beyond the mounting surface 21 of the mounting table 2 and the wafer W is supported above the mounting table 2. As shown in FIG. 3, when the lifter pin 61 is lowered, the pin main body 61a is accommodated in the pin through hole 200 and the wafer W is mounted on the mounting table 21. In this manner, the lifter pin 61 vertically moves the wafer W.

In the plasma processing apparatus 100, a voltage of the high frequency power applied to the mounting table 2 is increased. When the voltage of the high frequency power applied to the mounting table 2 is increased, abnormal discharge may occur at the pin through hole 200.

Figure 4:
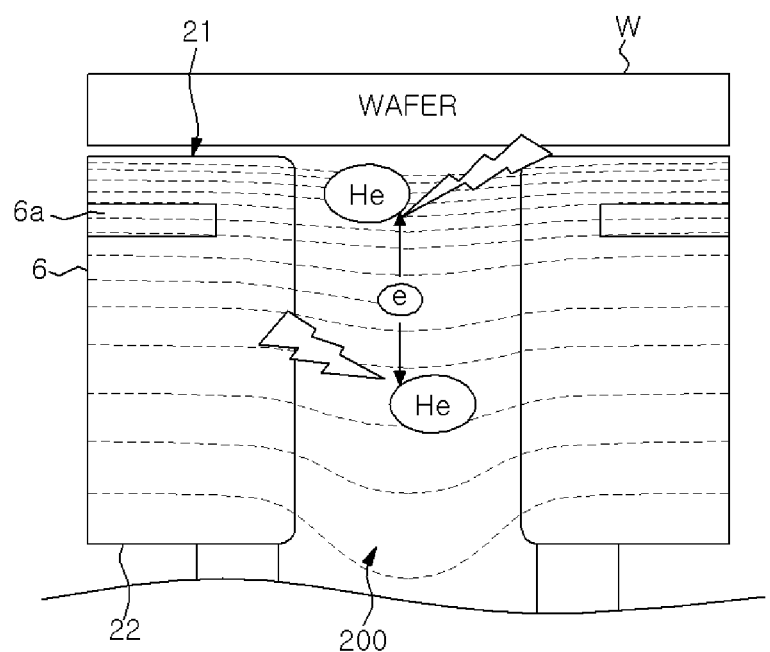
FIG. 4 schematically shows a potential state near a pin through hole of an electrostatic chuck.

FIG. 4 schematically shows a state of a potential at a vicinity of the pin through hole of the electrostatic chuck. As shown in FIG. 4, the electrostatic chuck 6 has the mounting surface 21 and the back surface 22 opposite to the mounting surface 21. The wafer W is mounted on the mounting surface 21. The pin through hole 200 is formed in the electrostatic chuck 6. In the plasma processing apparatus 100, when the high frequency power is applied to the mounting table 2, a potential difference is generated between the wafer W and the back surface 22 of the electrostatic chuck 6 due to an electrostatic capacity of the electrostatic chuck 6. In FIG. 4, equipotential lines of RF potential which are generated when the high frequency power is applied to the mounting table 2 are indicated by dashed lines. For example, in the plasma processing apparatus 100, abnormal discharge occurs when the potential difference of the RF potential generated in the pin through hole 200 exceeds a tolerable value at which abnormal discharge occurs due to an increase in the voltage of the high frequency power applied to the mounting table 2.

Therefore, in the plasma processing apparatus 100, the conductive film 61c of a conductive material is formed at the leading end portion of the lifter pin 61 which corresponds to the pin through hole 200, as can be seen from FIGS. 2 and 3.

(Example of Changes in Electrical Characteristics Due to Presence of Conductive Film)

Figure 5:
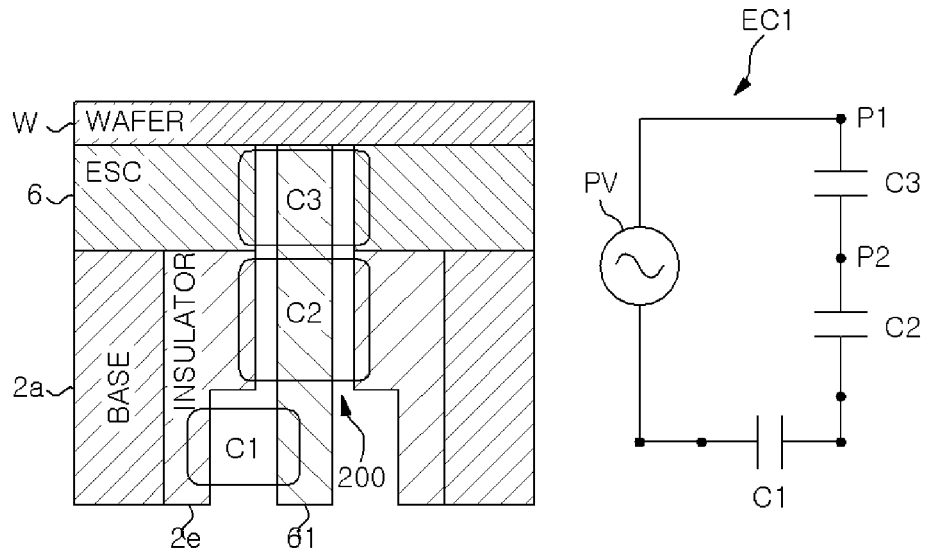
FIGS. 5 and 6 schematically show a leading end portion of a lifter pin inserted into the pin through hole.
Figure 6:
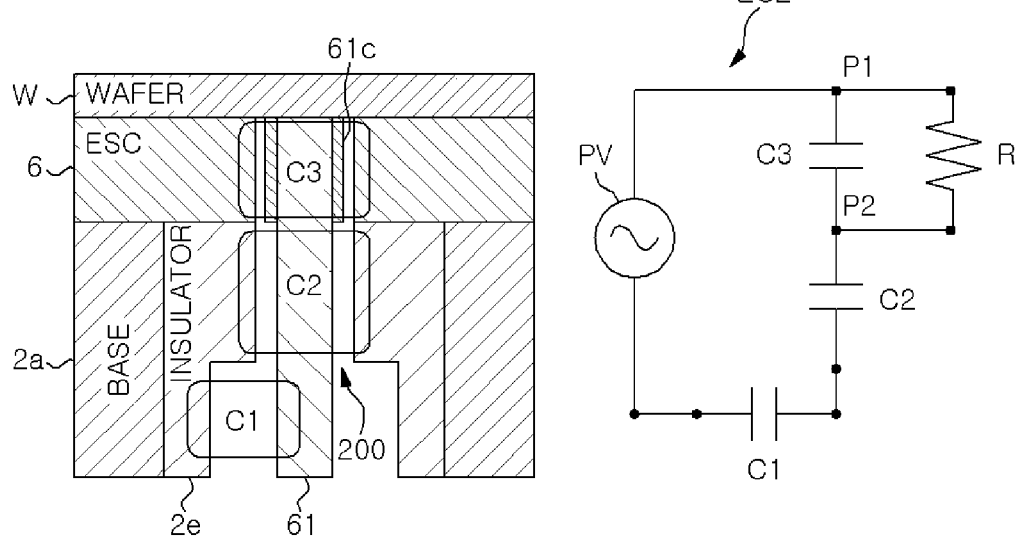

The changes in electrical characteristics of the mounting table 2 due to the presence of the conductive film 61c formed at the leading end portion of the lifter pin 61 will be explained with reference to FIGS. 5 and 6. FIGS. 5 and 6 schematically show the leading end portion of the lifter pin accommodated in the pin through hole. As shown in FIGS. 5 and 6, the pin through hole 200 is formed in the electrostatic chuck 6 of the mounting table 2 and the wafer W is mounted on the electrostatic chuck 6. The electrostatic chuck 6 is supported on the base 2a. The base 2a is provided with an insulator 2e for insulation. In FIG. 5, there is illustrated a state in which the conductive film 61c is not formed at the leading end portion of the lifter pin 61. In FIG. 6, there is illustrated a state in which the conductive film 61c is formed at the leading end portion of the lifter pin 61. When the high frequency power is applied to the mounting table 2, a part of the insulator 2e may be electrically regarded as, e.g., capacitors C1 and C2. The lifter pin 61 and a space in the pin through hole 200 which surrounds the lifter pin 61 may be regarded as a capacitor C3. At the right sides of FIGS. 5 and 6, there are illustrated equivalent circuits EC1 and EC2 equivalently showing electrical states at the time of applying the high frequency power. As shown in FIG. 5, when the high frequency power is applied to the mounting table 2, the vicinity of the pin through hole 200 of the mounting table 2 may be regarded as the equivalent circuit EC1 in which the capacitors C1 to C3 are connected in series to a power supply PV for supplying the high frequency power. The power supply PV may be, e.g., the first RF power supply 10a and the second RF power supply 10b. A connecting point between the capacitor C3 and the power supply PV of the equivalent circuit EC1 is set to P1. A connecting point between the capacitor C3 and the capacitor C2 is set to P2. A potential difference between the connecting point P1 and the connecting point P2 corresponds to an RF potential difference generated in the pin through hole 200. When the voltage of the high frequency power supplied from the power supply PV is increased, the potential difference between the connecting point P1 and the connecting point P2 is increased. Accordingly, abnormal discharge occurs.

When the conductive film 61c is formed at the leading end portion of the lifter pin 61 as shown in FIG. 6, the conductive film 61c may be regarded as a resistor R connected in parallel to the capacitor C3 shown in the equivalent circuit EC2. When the resistor R is connected in parallel to the capacitor C3, the potential difference between the connecting point P1 and the connecting point P2 can be reduced. In other words, the conductive film 61c can reduce the RF potential difference generated in the pin through hole 200.

As for the conductive material used for the conductive film 61c, it is possible to use a metal or a conductive material such as silicon, carbon, silicon carbide, silicon nitride, titanium dioxide, aluminum or the like.

The conductive film 61c may have a resistance value that allows the RF potential difference generated in the pin through hole 200 by the high frequency power applied to the mounting table 2 to be smaller than the tolerable value at which discharge occurs. When the resistance value of the conductive film 61c is too low, an excessive current is generated at the conductive film 61c. Therefore, it is preferable that the conductive film 61c has a thickness that is enough to prevent the flow of an excessive current. As the frequency of the high frequency power is increased, the current is focused on the surface of the conductive film 61c. This phenomenon is referred to as skin effect and expressed by the following Eq. (1).

Eq. (1)

$$\delta = \sqrt{\frac{\rho}{\pi \cdot \mu \cdot f}} \text{ (m)} \quad (1)$$

$$\mu = \mu o \times \mu s$$
$$\mu o = 1.2566370614e-6 \text{(H/m)}$$

Here, $\delta$ indicates a thickness (depth) from the surface on which the current flow; $\rho$ indicates an electrical resistivity of the conductive material used for the conductive film 61c; $\mu$ indicates a permeability of the conductive material used for the conductive film 61c; $\mu s$ indicates a relative permeability of the conductive material used for the conductive film 61c; and f indicates a frequency of a high frequency power.

FIG. 7 shows an example of a calculation result of the skin effect. The example shown in FIG. 7 shows calculation results of the thickness $\delta$ of a first to a third conductive material at the frequency f of 40 MHz and 400 kHz. For example, the first conductive material has an electrical resistivity $\rho$ of $4.5e^2$ and a relative permeability $\mu s$ of 1. The first conductive material has a thickness δ of $1.69e^0$[m] at the frequency f of 40 MHz. The second conductive material has an electrical resistivity ρ of $1.0e^6$ and a relative permeability μs of 1. The second conductive material has a thickness δ of $7.96e^1$[m] at the frequency f of 40 MHz.

When the conductive film 61c has a thickness smaller than the thickness δ of the skin effect of the conductive material used for the conductive film 61c, the flow of the current is restricted and the electrical resistance is increased and, thus, the generated current is decreased. Therefore, the thickness of the conductive film 61c is preferably 10% or less and more preferably 1% or less of the thickness δ of the skin effect of the conductive material used for the conductive film 61c. Accordingly, the generation of an excessive current at the conductive film 61c can be suppressed.

Figure 8:
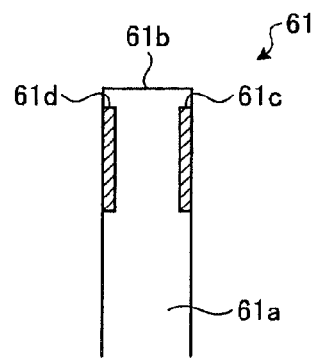
FIG. 8 shows an example in which a conductive film is formed at the leading end portion of the lifter pin.

Further, the conductive film 61c may be formed flat without a step at the leading end portion of the lifter pin 61. FIG. 8 shows an example in which the conductive film is formed at the leading end portion of the lifter pin. The lifter pin 61 has a recess 61d having a depth corresponding to the film thickness of the conductive film 61c at the leading end portion of the pin main body 61a. The lifter pin 61 may have the conductive film 61c formed in the recess 61d of the pin main body 61a.

Figure 9:
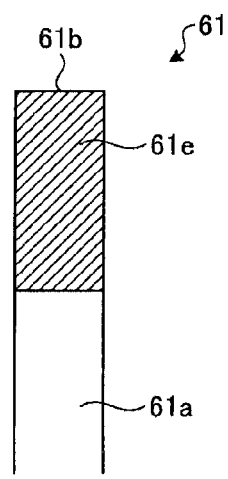
FIG. 9 shows an example in which a conductive material forms the leading end portion of the lifter pin.

Further, the lifter pin 61 has a thin leading end portion in order to reduce contact with the wafer W. The lifter pin 61 of the present embodiment has a cylindrical leading end portion having an outer diameter of, e.g., a few mm. The outer diameter of the leading end portion of the lifter pin 61 may be smaller than the thickness δ of the skin effect of the conductive material used for the conductive film 61c. In that case, the leading end portion of the lifter pin 61 may be formed of the conductive material. For example, when the outer diameter of the leading end portion of the lifter pin 61 is preferably 10% or less and more preferably 1% or less of the thickness δ of the skin effect of the conductive material, the leading end portion of the lifter pin 61 may be formed of the conductive material. For example, the second conductive material has a thickness δ of $7.96e^1$[m] at the frequency f of 40 MHz and an outer diameter that is 1% or less of the outer diameter of the leading end portion of the lifter pin 61. In that case, the second conductive material may form the leading end portion of the lifter pin 61. FIG. 9 shows an example in which the leading end portion of the lifter pin is formed of the conductive material. The lifter pin 61 has a conductive portion 61e formed of the conductive material extending from the pin upper end portion 61b of the lifter pin 61 by a distance corresponding to the thickness of the electrostatic chuck 6.

Figure 10:
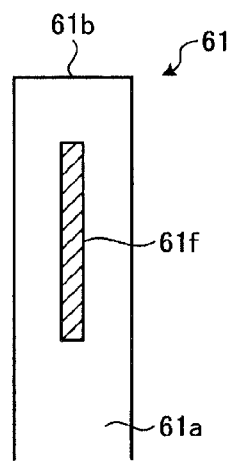
FIG. 10 shows an example in which a conductive portion is embedded in the leading end portion of the lifter pin.
Figure 11:
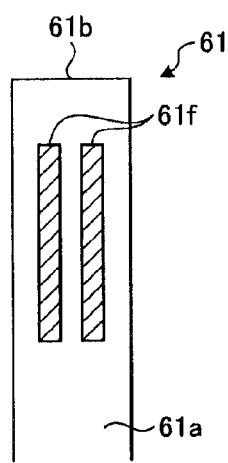
FIG. 11 shows another example in which the conductive portion is embedded in the leading end portion of the lifter pin.

Further, the lifter pin 61 may include a conductive material in a leading end portion corresponding to the pin through hole 200. In other words, a conductive portion formed of a conductive material may be embedded in the leading end portion of the lifter pin 61 which corresponds to the pin through hole 200. FIG. 10 shows an example in which the conductive portion is embedded in the leading end portion of the lifter pin. In the lifter pin 61 shown in FIG. 10, a conductive portion 61f formed of a conductive material is embedded in the leading end portion corresponding to the pin through hole 200. A plurality of conductive portions 61f may be embedded. FIG. 11 shows another example in which the conductive portion is embedded in the leading end portion of the lifter pin. In the lifter pin 61 shown in FIG. 11, two conductive portions 61f are embedded in the leading end portion corresponding to the pin through hole 200. Three or more conductive portions 61f may be embedded.

(Simulation of Potential Change)

Figure 12A:
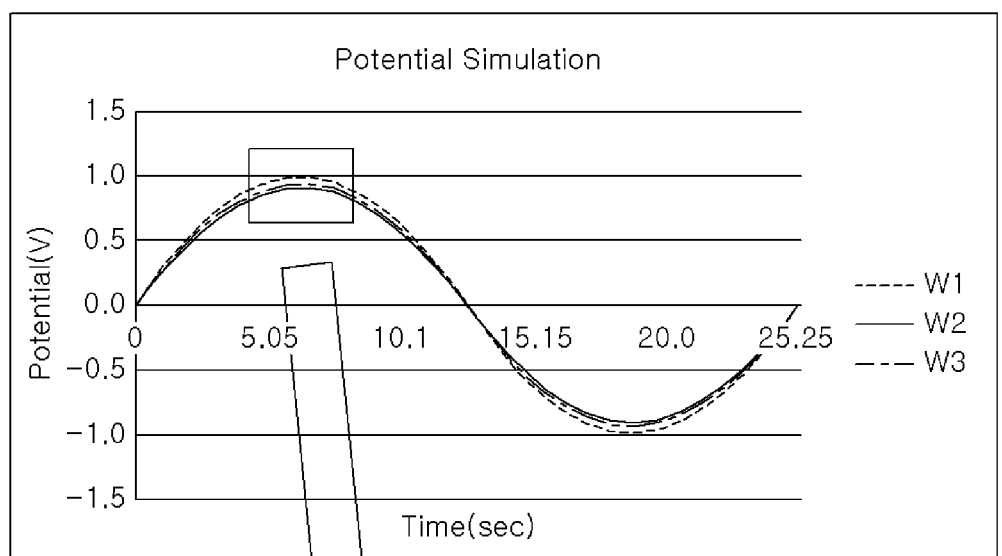
FIGS. 12A and 12B show simulation of potential changes in the pin through hole using equivalent circuits.
Figure 12B:
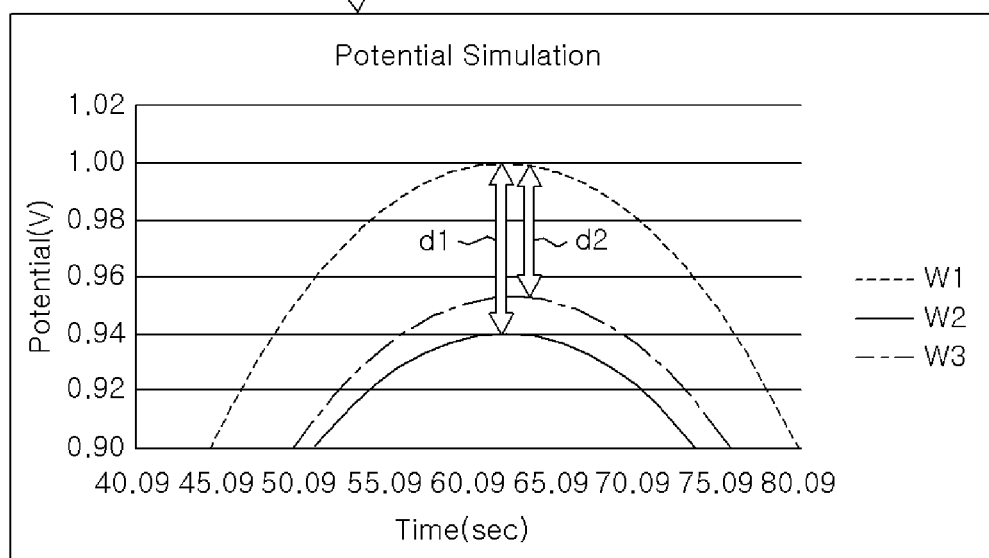

FIGS. 12A and 12B show simulation of potential changes in the pin through hole using equivalent circuits. In FIG. 12A, three waveforms W1 to W3 showing potential changes are illustrated. The waveform W1 shows the potential of the connecting point P1 in the equivalent circuits EC1 and EC2 shown in FIGS. 5 and 6. The waveform W2 shows the potential of the connecting point P2 in the equivalent circuit EC1 shown in FIG. 5. In other words, the waveform W2 shows potential changes in the case where the conductive film 61c is not formed at the leading end portion of the lifter pin 61. The waveform W3 shows the potential of the connecting point P2 in the equivalent circuit EC2 shown in FIG. 6. In other words, the waveform W3 shows potential changes in the case where the conductive film 61c is formed at the leading end portion of the lifter pin 61. FIG. 12B shows waveforms obtained by enlarging peak portions of the waveforms W1 to W3 shown in FIG. 12A. A potential difference d1 between the waveform W1 and the waveform W2 shown in FIG. 12B indicates a potential difference generated when the conductive film 61c is not formed at the leading end portion of the lifter pin 61. A potential difference d2 between the waveform W1 and the waveform W3 indicates a potential difference generated when the conductive film 61c is formed at the leading end portion of the lifter pin 61. The potential difference d2 is smaller than the potential difference d1. In other words, the potential difference is reduced when the conductive film 61c is formed at the leading end portion of the lifter pin 61. Accordingly, the occurrence of abnormal discharge at the pin through hole 200 can be suppressed.

The plasma processing apparatus 100 of the first embodiment includes the electrostatic chuck 6 and the lifter pin 61. The electrostatic chuck 6 has the mounting surface 21 for mounting thereon the wafer W and the back surface 22 opposite to the mounting surface 21. The pin through hole 200 is formed through the mounting surface 21 and the back surface 22. At least a part of the lifter pin 61 is made of an insulating member. The leading end of the lifter pin 61 is accommodated in the pin through hole 200. The wafer W is vertically moved by vertically moving the lifter pin 61 with respect to the mounting surface 21. In the plasma processing apparatus 100, the conductive film 61c or the conductive portion 61e is formed at the leading end portion of the lifter pin 61 which corresponds to the pin through hole 200. Accordingly, the plasma processing apparatus 100 can suppress the occurrence of abnormal discharge at the pin through hole 200.

Second Embodiment

In the plasma processing apparatus 100 of the first embodiment, the conductive material is provided at the leading end portion of the lifter pin 61 which corresponds to the pin through hole 200. In the plasma processing apparatus 100 of the second embodiment, the conductive material is provided at a wall surface of the pin through hole 200 which faces the lifter pin 61.

Figure 13:
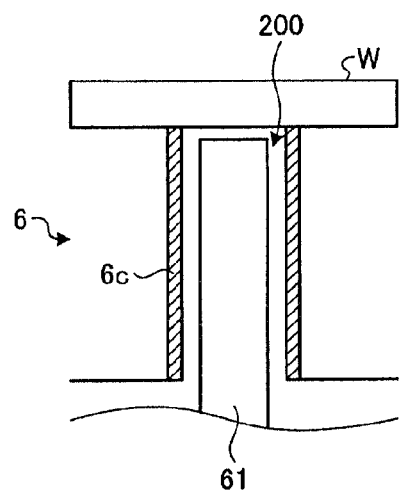
FIG. 13 shows an example in which a conductive material is provided at a wall of the pin through hole which faces the lifter pin.

FIG. 13 shows an example in which the conductive material is provided at the wall surface of the pin through hole which faces the lifter pin. The pin through hole 200 is formed in the electrostatic chuck 6. The wafer W is mounted on the electrostatic chuck 6. The leading end of the lifter pin 61 is accommodated in the pin through hole 200. The electrostatic chuck 6 has the conductive film 6c formed of the conductive material at the wall surface of the pin through hole 200 which faces the lifter pin 61.

Figure 14:
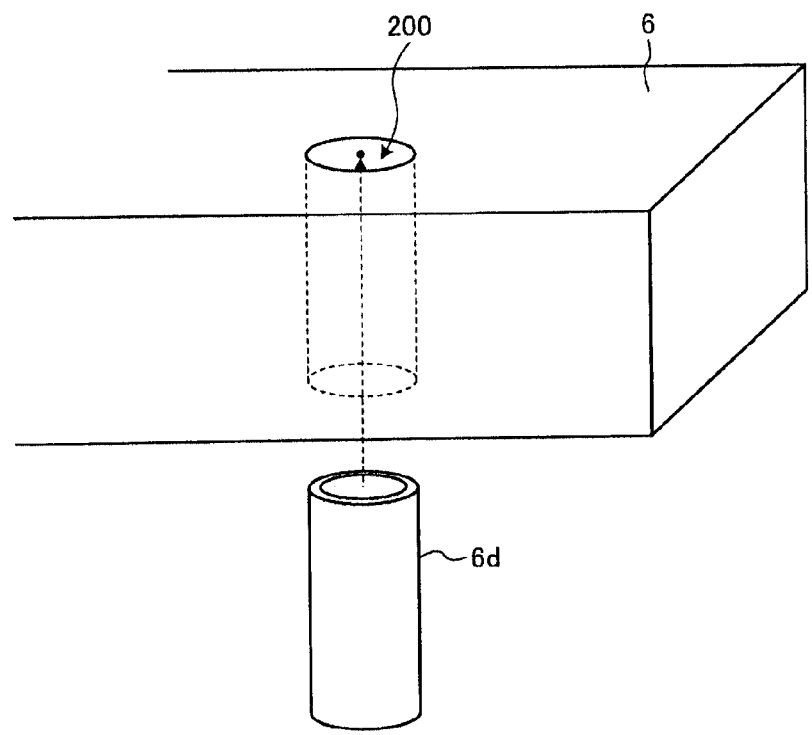
FIG. 14 is a perspective view schematically showing a vicinity of the pin through hole of the electrostatic chuck.

A conductive cylindrical member may be provided, instead of the conductive film 6c, in the pin through hole 200. FIG. 14 is a perspective view schematically showing the vicinity of the pin through hole of the electrostatic chuck. The pin through hole 200 is formed in the electrostatic chuck 6. The conductive material may be provided at the wall surface of the pin through hole 200 which faces the lifter pin 61 by inserting a conductive cylindrical member 6d having a shape conformal to that of the pin through hole 200 into the pin through hole 200. For example, the entire pin spacer 201 or a part of the pin spacer 201 which corresponds to the electrostatic chuck 6 may be formed of the conductive material.

As for the conductive material used for the conductive film 6c and the cylindrical member 6d, it is possible to use a metal or a conductive material such as silicon, carbon, silicon carbide, silicon nitride, titanium dioxide, aluminum or the like.

The conductive film 6c and the cylindrical member 6d electrically act as in the case of the conductive film 61c in the first embodiment and thus can reduce the RF potential difference generated in the pin through hole 200.

The plasma processing apparatus 100 of the second embodiment has the conductive film 6c or the cylindrical member 6d at the wall surface of the pin through hole 200 which faces the lifter pin 61. Accordingly, the plasma processing apparatus 100 can suppress the occurrence of abnormal discharge at the pin through hole 200.

Third Embodiment

Next, a third embodiment will be described. Since the configuration of a plasma processing apparatus according to a third embodiment is substantially the same as that of the plasma processing apparatus 100 shown in FIG. 1, like reference numerals will be given to like parts and redundant description thereof will be omitted. Hereinafter, the differences will be mainly described.

Figure 15A:
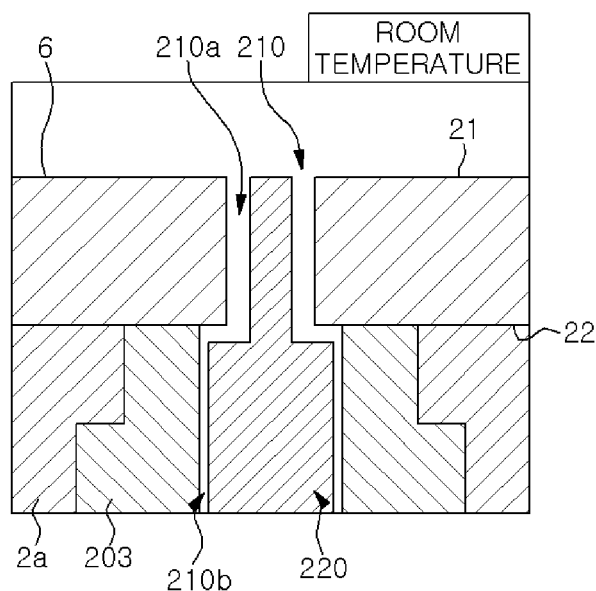
FIG. 15A is a schematic cross sectional view showing a mounting table.

FIG. 15A is a schematic cross sectional view of the mounting table. The aforementioned gas supply line 30 is provided in the mounting table 2. A gas supply through hole 210 is formed at a leading end portion of the gas supply line 30. The gas supply through hole 210 includes through holes 210a and 210b. The through hole 210a is formed in the electrostatic chuck 6. The through hole 210b is formed in the base 2a. The through holes 210a and 210b are formed such that the positions thereof coincide with each other at, e.g., a room temperature. An insertion member 220 is provided in the gas supply through hole 210 while being spaced apart from an inner wall of the gas supply through hole 210.

The occurrence of abnormal discharge at the gas supply through hole 210 can be suppressed by reducing the gap between the insertion member 220 and the gas supply through hole 210. Therefore, the gap between the insertion member 220 and the gas supply through hole 210 can be reduced by making the leading end portion of the insertion member 220 thicker. The occurrence of abnormal discharge at the gas supply through hole 210 can also be suppressed by making a linear portion of a heat transfer gas path shorter. This is because energy of electrons in the heat transfer gas is decreased by making the linear portion of the heat transfer gas path shorter. Accordingly, in the gas supply through hole 210, the diameter of the through hole 210b is greater than that of the through hole 210a and a portion of the insertion member 220 which corresponds to the through hole 210b is made thicker than the leading end portion of the insertion member 220.

Figure 15B:
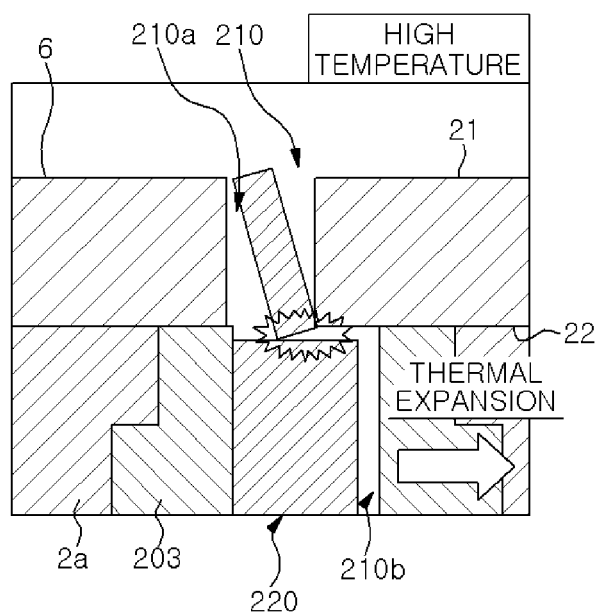
FIG. 15B explains damage of an insertion member.

However, when the gap between the insertion member 220 and the gas supply through hole 210 is reduced, the insertion member 220 may be broken. FIG. 15B explains damage of the insertion member. When the plasma treatment is performed, the temperature of the mounting table 2 is increased to, e.g., 100° C. to 200° C. When the temperature is increased, the electrostatic chuck 6 and the base 2a are thermally expanded. Due to a difference in thermal expansion between the electrostatic chuck 6 and the base 2a, the positions of the through hole 210a and the through hole 210b are misaligned. Therefore, in the case of reducing the gap between the insertion member 220 and the gas supply through hole 210 by making the leading end portion of the insertion member 220 thicker, the insertion member 220 may be broken due to the positional misalignment between the through hole 210a and the through hole 210b.

Accordingly, a part of the insertion member 220 is formed of an elastic material. For example, at least a portion of the insertion member 220, which corresponds to a connection region between the through hole 210a and the through hole 210b, may be formed of an elastic material.

Figure 16A:
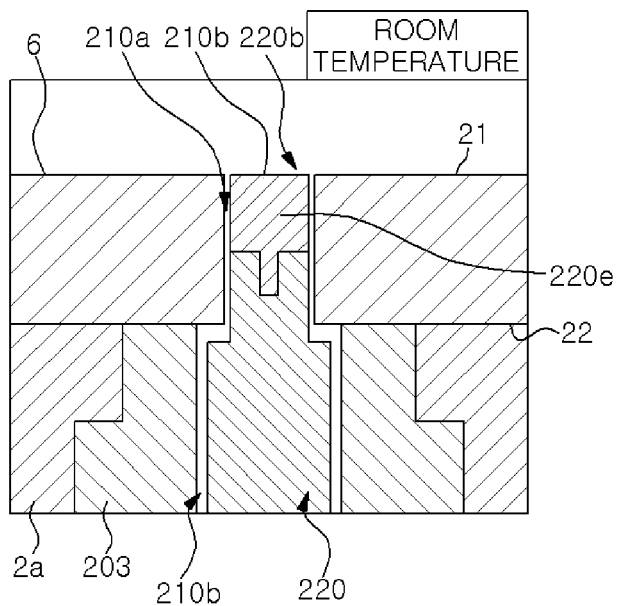
FIGS. 16A and 16B explain an insertion member according to a third embodiment.

FIG. 16A explains an insertion member according to the third embodiment. For example, in the insertion member 220 accommodated in the gas supply through hole 210, a conductive portion 220e formed of a conductive material is formed at a leading end portion from the upper end portion 220b to an upper half portion of the through hole 210a and an elastic portion formed of an elastic material is provided below the conductive portion 220e. The elastic portion may have elasticity enough to prevent damage from the positional misalignment between the through hole 210a and the through hole 210b which is caused by temperature changes. Further, the elastic portion preferably has plasma resistance. The elastic portion may be made of, e.g., a fluorine-based resin. The fluorine-based resin may be, e.g., polytetrafluoroethylene. Polytetrafluoroethylene serves as an insulating member. The elastic portion is not necessarily made of a fluorine-based resin and may be a member having Young's modulus of 20 GPa or less. A member having Young's modulus of 10 GPa or less is more preferably used.

Figure 16B:
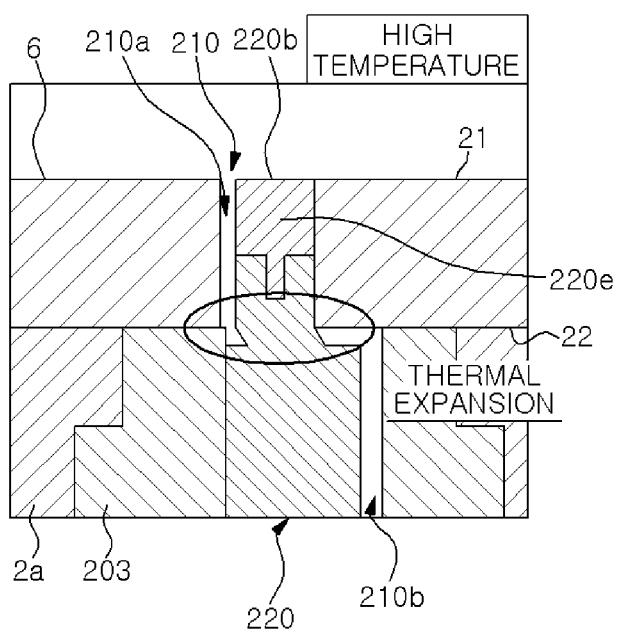

FIG. 16B explains the insertion member according to the third embodiment. Even when the temperatures of the electrostatic chuck 6 and the base 2a are increased by the plasma treatment and the through hole 210a and the through hole 210b are positionally misaligned due to the difference in thermal expansion between the electrostatic chuck 6 and the base 2a, the portion of the insertion member 220 which allows communication between the through hole 210a and the through hole 210b is deformed and, thus, the damage of the insertion member 220 can be suppressed. When the temperatures of the electrostatic chuck 6 and the base 2a are returned to a room temperature, the positional misalignment between the through hole 210a and the through hole 210b is eliminated and the shape of the insertion member 220 is restored, as can be seen from FIG. 16A. Accordingly, even when the gap between the insertion member 220 and the gas supply through hole 210 is reduced, the damage of the insertion member 220 can be suppressed.

The plasma processing apparatus 100 of the third embodiment includes the electrostatic chuck 6 and the base 2a. The electrostatic chuck 6 has the mounting surface 21 for mounting thereon the wafer W and the back surface 22 opposite to the mounting surface 21. The through hole 210a is formed through the mounting surface 21 and the back surface 22. The base 2a has a supporting surface for supporting the electrostatic chuck 6. The through hole 210b communicating with the through hole 210a is formed in the base 2a. The insertion member 220 is provided in the through hole 210a and the through hole 210b. At least a portion of the insertion member 220, which corresponds to the connection region between the through hole 210a of the electrostatic chuck 6 and the through hole 210b of the base 2a, is formed of an elastic material. Accordingly, in the plasma processing apparatus 100, even when the gap between the insertion member 220 and the gas supply through hole 210 is reduced to suppress the occurrence of abnormal discharge at the gas supply through hole 210, the damage of the insertion member 220 can be suppressed.

While the embodiments have been described, the present disclosure is not limited to the above-described embodiments and may be variously modified or changed within the scope of the present disclosure as defined in the claims.

For example, the first to the third embodiment may be implemented in combination. For example, in the plasma processing apparatus 100, the conductive film 61c may be formed at the leading end portion of the lifter pin 61 which corresponds to the pin through hole 200 and the conductive film 6c may be formed at the wall surface of the pin through hole 200 which faces the lifter pin 61. Further, in the plasma processing apparatus 100, the lifter pin 61 may be formed in the same manner as the insertion member 220. The insertion member 220 may be formed of a conductive material as in the case of the lifter pin 61.

The conductive film 61c or the conductive portion 61e of the first embodiment may not be provided at the entire main surface of the leading end portion of the lift pin 61 which corresponds to the pin through hole 200. For example, the conductive film 61c or the conductive portion 61e may be provided at a part of the main surface of the leading end portion in the circumferential direction. For example, the conductive film 61c or the conductive portion 61e may be provided at multiple portions of the main surface of the leading end portion of the lifter pin 61 which are spaced apart from each other in the circumferential direction and which has a height corresponding to the thickness of the electrostatic chuck 6. The conductive film 6c of the second embodiment may not be provided at the entire wall surface of the pin through hole 200 which faces the lifter pin 61. For example, the conductive film 6c may be provided at a part of the wall surface of the pin through hole 200 in the circumferential direction. For example, the conductive film 61c may be provided at multiple portions of the wall surface of the pin through hole 200 which are spaced apart from each other in the circumferential direction and which has a height corresponding to the length of the pin through hole 200.

In the first and the second embodiment, the plasma processing apparatus 100 may use a plasma generated by a radial line slot antenna.

While the disclosure has been shown and described with respect to the embodiments, it will be understood by those skilled in the art that various changes and modifications may be made without departing from the scope of the disclosure as defined in the following claims.

What is claimed is:

1. A plasma processing apparatus comprising:
an electrostatic chuck including a mounting surface on which a target object is mounted and a back surface opposite to the mounting surface, the electrostatic chuck having a first through hole formed through the mounting surface and the back surface;
a base including a supporting surface for supporting the electrostatic chuck, the base having a second through hole communicating with the first through hole; and
an insertion member provided in the first through hole and the second through hole,
wherein at least a portion of the insertion member, which corresponds to a connection region between the first through hole of the electrostatic chuck and the second through hole of the base, is formed of an elastic material.

2. The plasma processing apparatus of claim 1, wherein the elastic material has Young's modulus of 20 Gpa or less.

3. The plasma processing apparatus of claim 2, wherein the insertion member has a conductive film formed of a conductive material at a leading end portion corresponding to the first through hole.

4. The plasma processing apparatus of claim 2, wherein the insertion member has a leading end portion provided in the first through hole and the leading end portion is formed of a conductive material.

5. The plasma processing apparatus of claim 2, wherein the insertion member has a leading end portion provided in the first through hole and a conductive portion is buried in the leading end portion.

6. The plasma processing apparatus of claim 2, wherein a conductive film formed of a conductive material is provided at at least one of a wall surface of the first through hole which faces the insertion member and a wall surface of the second through hole which faces the insertion member.

7. The plasma processing apparatus of claim 2, wherein a conductive cylindrical member is provided in the first through hole and the second through hole.

8. The plasma processing apparatus of claim 1, wherein the insertion member has a conductive film formed of a conductive material at a leading end portion corresponding to the first through hole.

9. The plasma processing apparatus of claim 1, wherein the insertion member has a leading end portion provided in the first through hole and the leading end portion is formed of a conductive material.

10. The plasma processing apparatus of claim 1, wherein the insertion member has a leading end portion provided in the first through hole and a conductive portion is buried in the leading end portion.

11. The plasma processing apparatus of claim 1, wherein a conductive film formed of a conductive material is provided at at least one of a wall surface of the first through hole which faces the insertion member and a wall surface of the second through hole which faces the insertion member.

12. The plasma processing apparatus of claim 1, wherein a conductive cylindrical member is provided in the first through hole and the second through hole.

* * * * *